US 9,362,222 B2

United States Patent
Hsueh et al.

(10) Patent No.: US 9,362,222 B2
(45) Date of Patent: Jun. 7, 2016

(54) INTERCONNECTION BETWEEN INDUCTOR AND METAL-INSULATOR-METAL (MIM) CAPACITOR

(71) Applicant: Taiwan Semiconductor Manufacturing Co., Ltd., Hsin-Chu (TW)

(72) Inventors: Chih-Hung Hsueh, Tainan (TW); Yen-Hsiang Hsu, Kaoshiung (TW); Kuan-Chi Tsai, Kaosiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 162 days.

(21) Appl. No.: 14/064,990

(22) Filed: Oct. 28, 2013

(65) Prior Publication Data

US 2015/0115404 A1 Apr. 30, 2015

(51) Int. Cl.
| H01L 25/00 | (2006.01) |
| H01L 23/522 | (2006.01) |
| H01L 49/02 | (2006.01) |
| H01L 27/01 | (2006.01) |
| H01L 23/532 | (2006.01) |
| H01L 21/768 | (2006.01) |

(52) U.S. Cl.
CPC ...... *H01L 23/5226* (2013.01); *H01L 21/76816* (2013.01); *H01L 21/76829* (2013.01); *H01L 23/5223* (2013.01); *H01L 23/5227* (2013.01); *H01L 23/53295* (2013.01); *H01L 27/016* (2013.01); *H01L 28/10* (2013.01); *H01L 28/40* (2013.01); *H01L 28/60* (2013.01); *H01L 2924/0002* (2013.01)

(58) Field of Classification Search
CPC . H01L 51/0072; H01L 51/0067; H01L 51/56; H01L 33/62; H01L 51/5056
USPC .................................. 257/531, 532, E29.343
See application file for complete search history.

(56) References Cited

U.S. PATENT DOCUMENTS

| 8,263,437 | B2 * | 9/2012 | Lin et al. ........................ 438/124 |
| 2004/0106266 | A1 * | 6/2004 | Huang ................... H01L 28/60 438/393 |
| 2008/0012091 | A1 * | 1/2008 | Ding et al. .................... 257/531 |
| 2012/0181657 | A1 * | 7/2012 | Wu et al. ....................... 257/532 |

* cited by examiner

*Primary Examiner* — Andy Huynh
(74) *Attorney, Agent, or Firm* — Birch, Stewart, Kolasch & Birch, LLP (57) ABSTRACT

Embodiments of mechanisms for forming a semiconductor device structure are provided. The semiconductor device structure includes a metal-insulator-metal (MIM) capacitor formed on a substrate. The semiconductor device structure also includes an inductor formed on the MIM capacitor. The semiconductor device structure further includes a via formed between the MIM capacitor and the inductor, and the via is formed in a plurality of dielectric layers, and the dielectric layers comprise an etch stop layer.

16 Claims, 6 Drawing Sheets

INTERCONNECTION BETWEEN INDUCTOR AND METAL-INSULATOR-METAL (MIM) CAPACITOR

BACKGROUND

The semiconductor integrated circuit (IC) industry has experienced exponential growth. Technological advances in IC design and material have produced generations of ICs where each generation has smaller and more complex circuits than previous generations. In the course of IC evolution, functional density (i.e., the number of interconnected devices per chip area) has generally increased while geometric size (i.e., the smallest component (or line) that can be fabricated) has decreased.

One type of capacitor is a metal-insulator-metal (MIM) capacitor, which is used in mixed signal devices and logic devices, such as embedded memories and radio frequency devices. Metal-insulator-metal capacitors are used to store a charge in a variety of semiconductor devices. A metal-insulator-metal capacitor is formed horizontally on a semiconductor wafer, with two metal plates sandwiching a dielectric layer parallel to the wafer surface.

An inductor is a passive electrical component that can store energy in a magnetic field created by an electric current passing through it. The inductor is used in integrated circuits for many different types of applications. These applications can include, for example, communication systems, radar systems, television systems, highpass filters and tank circuits. Inductors can be miniaturized for use in compact communication systems, such as cell phones and modems, by fabricating spiral inductors on the same substrate as the integrated circuit to which they are coupled using integrated circuit manufacturing techniques.

However, there are many challenges related to forming a via between an inductor and a metal-insulator-metal (MIM) capacitor.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements.

Figure 1:
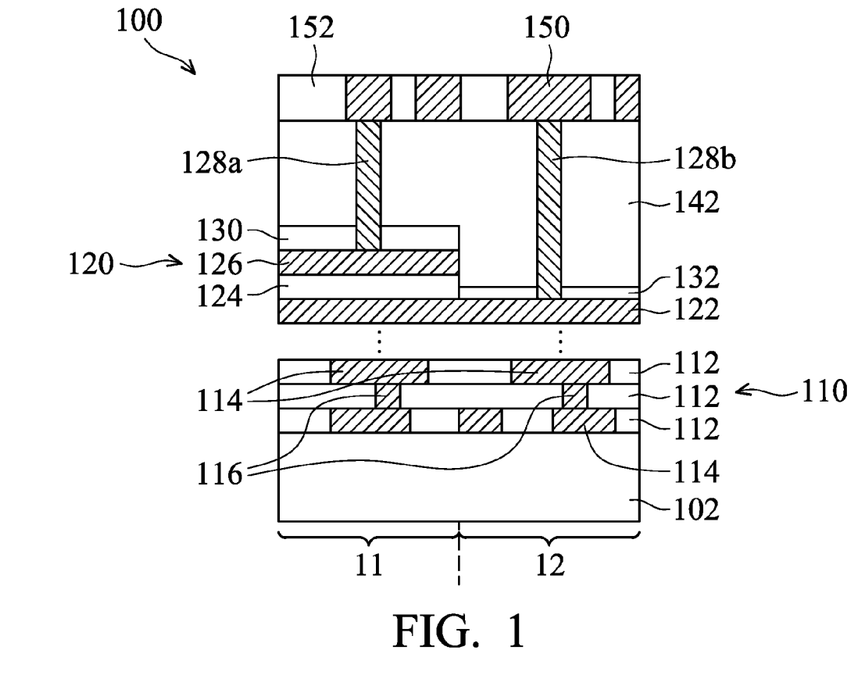
FIG. 1 shows a cross-sectional representation of a semiconductor device, in accordance with some embodiments of the disclosure.
Figure 2:
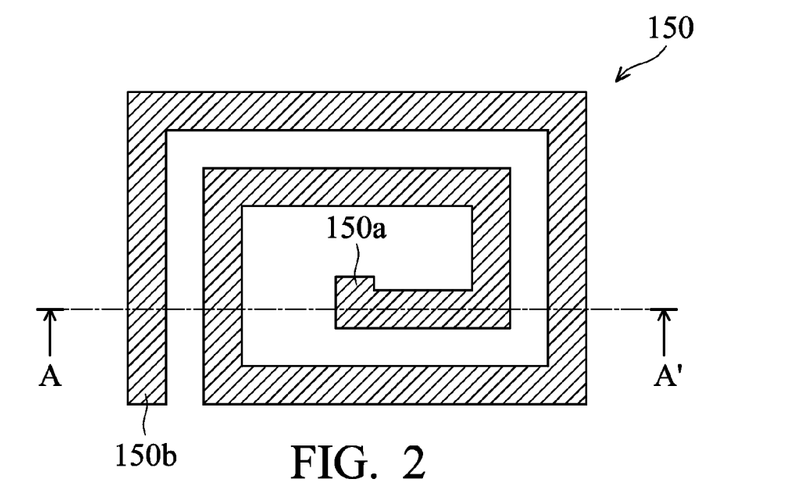
FIG. 2 shows a top-view of inductor in accordance with some embodiments of the disclosure.

Mechanisms for forming a semiconductor device structure are provided in accordance with some embodiments of the disclosure. FIG. 1 shows a cross-sectional representation of a semiconductor device 100 in accordance with some embodiments of the disclosure. FIG. 2 shows a top-view of inductor 150 in accordance with some embodiments of the disclosure. FIG. 1 shows a cross-sectional representation along AA' line shown in FIG. 2. The semiconductor device 100 includes a metal-insulator-metal (MIM) capacitor 120 and an inductor 150. MIM capacitor 120 and inductor 150 are passive components and are herein called radio frequency (RF) devices.

Referring to FIG. 1, a semiconductor substrate 102 is provided. Semiconductor substrate 102 includes a MIM region 11 and a non-MIM region 12. Semiconductor substrate 102 may be made of silicon or other semiconductor materials. Alternatively or additionally, semiconductor substrate 102 may include other elementary semiconductor materials such as germanium. In some embodiments, semiconductor substrate 102 is made of a compound semiconductor such as silicon carbide, gallium arsenic, indium arsenide, or indium phosphide. In some embodiments, semiconductor substrate 102 is made of an alloy semiconductor such as silicon germanium, silicon germanium carbide, gallium arsenic phosphide, or gallium indium phosphide. In some embodiments, semiconductor substrate 102 includes an epitaxial layer. For example, semiconductor substrate 102 has an epitaxial layer overlying a bulk semiconductor.

Semiconductor substrate 102 may further include isolation features (not shown), such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements, are formed in and/or on semiconductor substrate 102.

An interconnect structure 110 is formed over semiconductor substrate 102. In some embodiments, interconnect structure 110 including metal lines 114 and vias 116 is embedded in inter-metal dielectric (IMD) layers 112. In some embodiments, interconnect structure 110 is formed in a back-end-of-line (BEOL) process. Metal lines 114 and vias 116 may be made of conductive material, such as copper (Cu), aluminum (Al), tungsten (W), or applicable materials. In some embodiments, metal lines 114 and vias 116 are copper or copper alloy. In some embodiments, metal lines 114 and vias 116 are formed by single and/or dual damascence processes. Metal lines 114 include multiple metal layers (namely $M_1$, $M_2$, $M_3$ ..., and Mtop) which are interconnected through vias 116.

In some embodiments, inter-metal dielectric (IMD) layers 112 are made of silicon oxide. In some other embodiments, IMD layers 112 are made of un-doped silicate glass (USG), fluorinated silicate glass (FSG), carbon-doped silicate glass, silicon nitride or silicon oxynitride. In some embodiments, IMD layers 112 include multiple dielectric layers. One or more of the multiple dielectric layers are made of low dielectric constant (low-k) materials, such as a dielectric constant of less than about 3.0, or less than about 2.5. Interconnect structure 110 shown in FIG. 1 is merely for illustrative purposes. Interconnect structure 110 may include other configurations and may include one or more metal lines and IMD layers.

MIM capacitor 120 is formed over semiconductor substrate 102 (e.g. over MIM region 11). MIM capacitor 120 is a sandwich structure and an insulating layer 124 is formed between a capacitor bottom metal (CBM) layer 122 and a capacitor top metal (CTM) layer 126. In some embodiments, CBM layer 122 and CTM layer 126 are independently made of copper (Cu), copper alloy, aluminum (Al), aluminum (Al) alloy, tungsten (W) or tungsten (W) alloy. In some embodiments, CBM layer 122 and CTM layer 126 are formed by physical vapor deposition (PVD) processes. In some embodiments, CBM layer 122 has a thickness in a range from about 1000 A to about 20000 A. In some embodiments, CTM layer 126 has a thickness in a range from about 500 A to about 2000 A. In some embodiments, a barrier layer, such as titanium nitride (TiN), is formed over CBM layer 122 or CTM layer 126. In some embodiments, the insulating layer 124 is made of dielectric materials, such as silicon oxide, silicon nitride or silicon glass. In some embodiments, the insulating layer 124 is formed by a plasma enhanced chemical vapor deposition (PECVD) process.

As shown in FIG. 1, a first etch stop layer 130 is formed on CTM layer 126 over MIM region 11. In some embodiments, first etch stop layer 130 is a single dielectric layer. In some other embodiments, first etch stop layer 130 includes multiple dielectric layers. First etch stop layer 130 is made of silicon nitride (e.g., SiN), silicon oxynitride (e.g., SiON), silicon carbide (e.g., SiC), silicon oxycarbide (e.g., SiOC or SiCO), or silicon carbide nitride (e.g., SiCN). In some embodiments, first etch stop layer 130 is formed by a CVD, PECVD or metal organic chemical vapor deposition (MOCVD) process.

A second etch stop layer 132 is formed on CBM layer 122 over non-MIM region 12. Second etch stop layer 132 may include a single dielectric layer or multiple dielectric layers. In some embodiments, the material of second etch stop layer 132 is the same as that of first etch stop layer 130. In some embodiments, the material of second etch stop layer 132 is different with that of first etch stop layer 130. In some embodiments, a portion of first etch stop layer 130 is the same as a portion of second etch stop layer 132. For example, first etch stop layer 130 has multiple layers including a silicon oxynitride layer, silicon oxide layer and silicon nitride layer. Second etch stop layer 132 has multiple layers including a silicon oxide layer and silicon nitride layer.

As shown in FIG. 1, a via dielectric layer 142 is formed on first etch stop layer 130 and second etch stop layer 132. Via dielectric layer 142 is made of silicon oxide, un-doped silicate glass (USG), fluorinated silicate glass (FSG), carbon-doped silicate glass, silicon nitride or silicon oxynitride. Vias 128a, 128b are formed in via dielectric layer 142.

Inductor 150 embedded in an inductor dielectric layer 152 is formed over semiconductor substrate 102. Inductor 150 is made of conductive material, such as copper (Cu), copper alloy, aluminum (Al), aluminum (Al) alloy, tungsten (W) or tungsten (W) alloy. In some embodiments, inductor 150 is formed by a PVD process.

Inductor dielectric layer 152 may be made of un-doped silicate glass (USG), fluorinated silicate glass (FSG), carbon-doped silicate glass, silicon nitride or silicon oxynitride. In some embodiments, inductor dielectric layer 152 is formed by a CVD process.

According to Ampere's Law, as current flows through an electronic device, magnetic field is produced by the current. Undesirable eddy currents are created when the integrated circuit devices experience changes in the magnetic field. As shown in FIG. 1, because a current flows through inductor 150 which is parallel to a surface of semiconductor substrate 102, the magnetic field caused by inductor 150 is perpendicular to the surface of semiconductor substrate 102. In order to reduce the eddy current, inductor 150 is formed far away from the integrated circuit devices (not shown), such as transistors. Therefore, a first thick via 128a is formed between inductor 150 and CTM layer 126, and a second thick via 128b is formed between inductor 150 and CBM layer 122. In some embodiments, via 128a, 128b respectively have a thickness in a range from about 3000 A to about 100K A.

FIG. 2 shows a top-view of inductor 150 in accordance with some embodiments of the disclosure. Inductor 150 has a spiral conductive trace pattern. Inductor 150 has at least one turn and includes an inner end 150a and an outer end 150b. All of the spiral conductive trace patterns may substantially be in the same plane. According to actual application needs, the inner end 150a and outer end 150b, separately connect to other interconnect structures (not shown). In some embodiments, inductor 150 extends from the outer end 150b to the inner end 150a clockwise. In some other embodiment, inductor 150 extends counterclockwise.

Figure 3A:
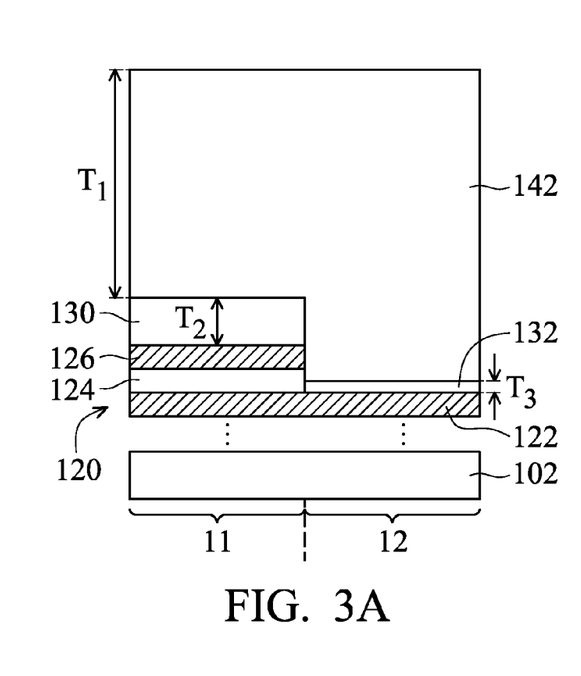
FIGS. 3A-3C show cross-sectional representations of various stages of forming a semiconductor device in accordance with some embodiments of the disclosure.
Figure 3B:
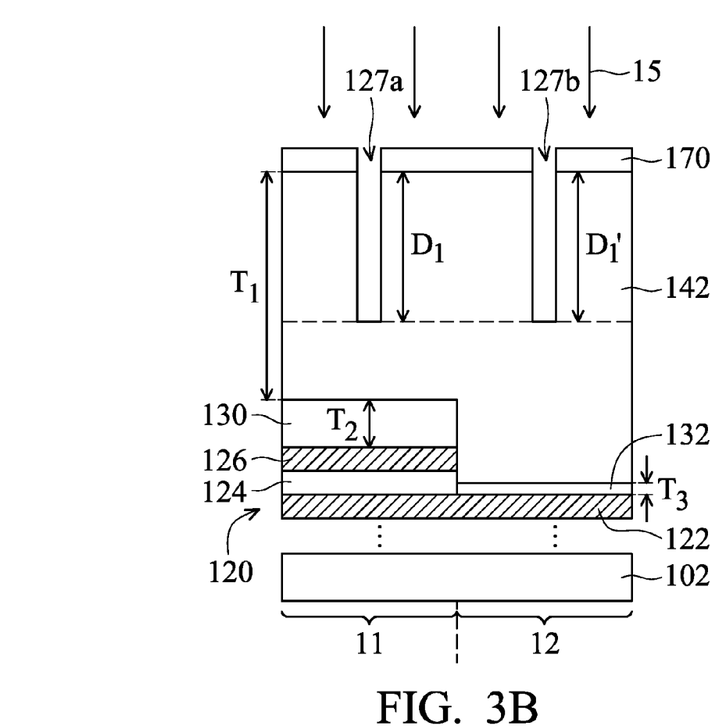
Figure 3C:
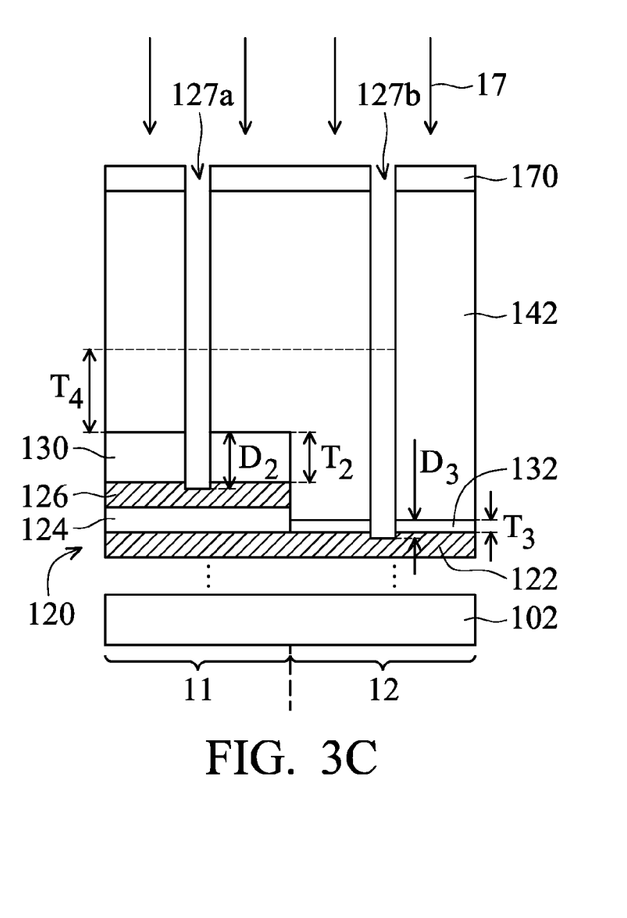

FIGS. 3A-3C show cross-sectional representations of various stages of forming a semiconductor device in accordance with some embodiments of the disclosure. For clarity, FIG. 3A shows a portion of semiconductor device 100 in FIG. 1.

CBM layer 122 is formed over semiconductor substrate 102 as shown in FIG. 3A in accordance with some embodiments. Afterwards, insulating layer 124, CTM layer 126 and first etch stop layer 130 are sequentially formed over CBM layer 122. Afterwards, insulating layer 124, CTM layer 126 and first etch stop layer 130 are patterned by a photolithography process and an etching process such that MIM capacitor 120 is formed over MIM region 11.

As shown in FIG. 3A, second etch stop layer 132 is formed over CBM layer 122 over non-MIM region 12. In some embodiments, a thickness of the first etch stop layer 130 is larger than a thickness of second etch stop layer 132. The etching process is etched from a top surface of via dielectric layer 142, and first etch stop layer 130 is closer to the top surface of via dielectric layer 142 than second etch stop layer 132. As a result, first etch stop layer 130 may be etched before second etch stop layer 132. Therefore, first etch stop layer 130 is thicker than second etch stop layer 132. In some embodiments, first etch stop layer 130 has a thickness $T_2$ in a range from about 300 A to about 2000 A. In some embodiments, second etch stop layer 132 has a thickness $T_3$ in a range from about 300 A to about 2000 A.

After forming second etch stop layer 132, via dielectric layer 142 is formed on first etch stop layer 130 and second etch stop layer 132. In order to form a relatively thick via in via dielectric layer 142, via dielectric layer 142 has a relatively thick thickness $T_1$. In some embodiments, thickness $T_1$ is in a range from about 3000 A to about 100K A.

Afterwards, a photoresist layer 170 is formed over via dielectric layer 142 and is patterned by a photolithography process and an etching process as shown in FIG. 3B in accordance with some embodiments. In some embodiments, portions of via dielectric layer 142, such as oxide portions, not covered by patterned photoresist layer 170 are removed by a first etching process 15 to form a first via hole 127a and a second via hole 127b in via dielectric layer 142. In some embodiments, first via hole 127a has a depth $D_1$ in a range from about 2700 A to about 90K A. In some embodiments, second via hole 127b has a depth $D_1'$ in a range from about 2700 A to about 90K A.

First etching process 15 is designed to etch the materials of via dielectric layer 142. In some embodiments, first etching process 15 is a dry etching process. In some embodiments, an etching gas including $CF_4$, $CHF_3$, or combinations thereof is used in first etching process 15. In some embodiments, first etching process 15 is performed under a power in a range from about 1000 W to about 2500 W.

Ideally, first via hole 127a and second via hole 127b are formed by etching the same materials, and therefore they have the same depth $D_1$. However, because via dielectric layer 142 has a relatively larger thickness, it is hard to control each of the via holes to reach a static depth due to etching limitations. In addition, via dielectric layer 142 in a central portion and in an edge portion of substrate 102 respectively have different thicknesses due to deposition limitations. In order to compensate for the derivations induced from etching limitations and deposition limitations, an over etching process (e.g. a second etching process 17) is performed after a main etching process (e.g. first etching process 15).

Afterwards, second etching process 17 is performed to continually etch via dielectric layer 142 as shown in FIG. 3C in accordance with some embodiments. Second etching process 17 is designed to remove the remaining via dielectric layer 142 but not etch through etch stop layers 130, 132. Therefore, second etching process 17 has a high selectivity toward the material of via dielectric layer 142 and first etch stop layer 130. For example, when via dielectric layer 142 is made of oxide and first etch stop layer 130 is made of nitride, the second etching process 17 has high selectivity toward oxide and nitride. In some embodiments, an etching selectivity of oxide to nitride is in a range from about 10/1 to about 5/1.

In some embodiments, second etching process 17 is a dry etching process. In some embodiments, an etching gas including $C_4F_8$, CO, or combinations thereof is used in second etching process 17. In some embodiments, second etching process 17 is performed under a power in a range from about 100 W to about 1500 W.

As mentioned above, in order to confirm that remaining via dielectric layer 142 is completely removed, second etching process 17 is performed to the remaining via dielectric layer 142. In some embodiments, an over etched depth $D_2$ by second etching process 17 is determined by the premeditated etched thickness $T_1$. For example, over etched depth $D_2$ is calculated by the following equation:

$$\text{over etched depth } D_2 = \text{premeditated etched thickness } T_1 \times A$$

A range A is in a range from about 30% to about 100%. Range A is calculated by considering the etching limitations and deposition limitations. In some embodiments, if thickness $T_1$ is 40,000 A, the etched depth $D_2$ by the second etching process 17 is about 12,000 A (40,000 A × 30%).

It should be noted that second etching process 17 is ideally designed to etch the remaining via dielectric layer 142 but not to etch through first etch stop layer 130. In some embodiments, remaining via dielectric layer with thickness $T_4$ is premeditated to remove. However, over etched depth $D_2$ of first via hole 127a over MIM region 11 is larger than thickness $T_2$ of first stop layer 130 in some embodiments. In addition, over etched depth $D_3$ of second via hole 127b over non-MIM region 12 is larger than thickness $T_3$ of second stop layer 130 in some embodiments. As a result, a portion of CTM layer 126 following first etch stop layer 130 is removed by second etching process 17. Therefore, some charges may accumulate on the exposed CTM layer 126 due to the power of second etching process 17. Therefore, MIM capacitor 120 may burn out.

In order to solve the burn out problem, some embodiments are provided. FIGS. 4A-4E show cross-sectional representations of various stages of forming a semiconductor device in accordance with some embodiments of the disclosure.

Figure 4A:
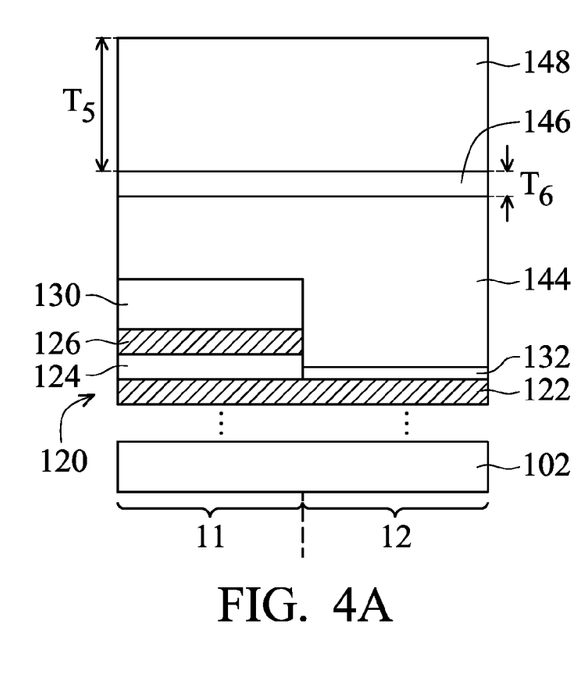
FIGS. 4A-4G show cross-sectional representations of various stages of forming a semiconductor device in accordance with some embodiments of the disclosure.

The semiconductor structure shown in FIG. 4A is similar to that in FIG. 3A except that a middle etch stop layer 146 is formed between a first via dielectric layer 144 and a second via dielectric layer 148 in FIG. 4A. First via dielectric layer 144 and second via dielectric layer 148 are respectively made of silicon oxide, un-doped silicate glass (USG), fluorinated silicate glass (FSG), carbon-doped silicate glass, silicon nitride or silicon oxynitride. In some embodiments, second via dielectric layer 148 has a thickness $T_5$ in a range from about 2700 A to about 90K A.

Middle etch stop layer 146 may be made of silicon nitride (e.g., SiN), silicon oxynitride (e.g., SiON), silicon carbide (e.g., SiC), silicon oxycarbide (e.g., SiOC or SiCO), or silicon carbide nitride (e.g., SiCN). In some embodiments, middle etch stop layer 146 is made of silicon nitride. In some embodiments, middle etch stop layer 146 is formed by chemical vapor deposition (CVD). In some embodiments, middle etch stop layer 146 has a thickness $T_6$ in a range from about 100 A to about 3000 A.

Figure 4B:
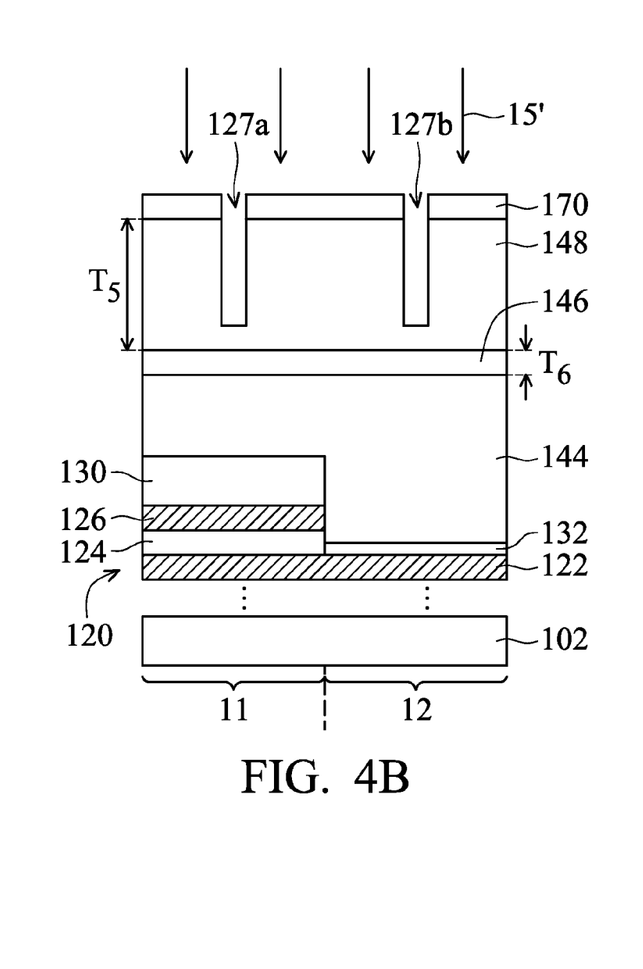

Afterwards, photoresist layer 170 is formed over second via dielectric layer 148 and is patterned by a photolithography process and an etching process as shown in FIG. 4B in accordance with some embodiments. Afterwards, portions of second via dielectric layer 148, such as silicon oxide portions, not covered by patterned photoresist layer 170 are removed by first etching process 15' to form first via hole 127a over MIM region 11 and second via hole 127b over non-MIM region 12. In some embodiments, first etching process 15' is similar to or the same with the first etching process.

Figure 4C:
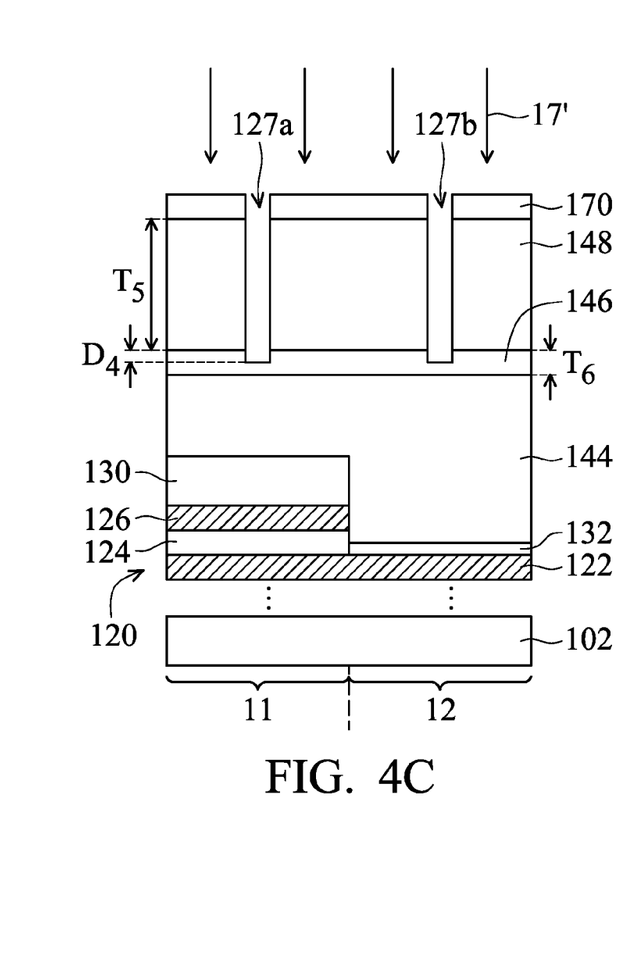

Afterwards, the remaining second via dielectric layer 148 and a portion of middle etch stop layer 146 are removed by second etching process 17' as shown in FIG. 4C in accordance with some embodiments. In some embodiments, second etching process 17' is similar to or the same with the first etching process.

As mentioned above, the over etching process (e.g. second etching process 17') is performed after the main etching process (e.g. first etching process 15'). An over etched depth is dependent on the etched depth of the via dielectric layer which will be premeditated to remove. For example, the over etched depth is decreased as the premeditated etched depth of the via dielectric layer is decreased.

It should be noted that thickness $T_5$ of second via dielectric layer 148 as shown in FIG. 4C is smaller than thickness $T_1$ of via dielectric layer 142 as shown in FIG. 3B. As a result, an over etched depth by second etching process 17' is reduced as the thickness of second via dielectric layer 148 is reduced from $T_1$ to $T_5$ by inserting middle etch stop layer 146. In addition, thickness $T_6$ of middle stop layer 146 is designed to be thick enough to prevent over etching. Therefore, bottoms of the first via hole 127a and the second via hole 127b are located above a bottom of middle etch stop layer 146. In other words, over etch depth $D_4$ by second etching process 17' is not larger than thickness $T_6$ of middle stop layer 146.

Figure 4D:
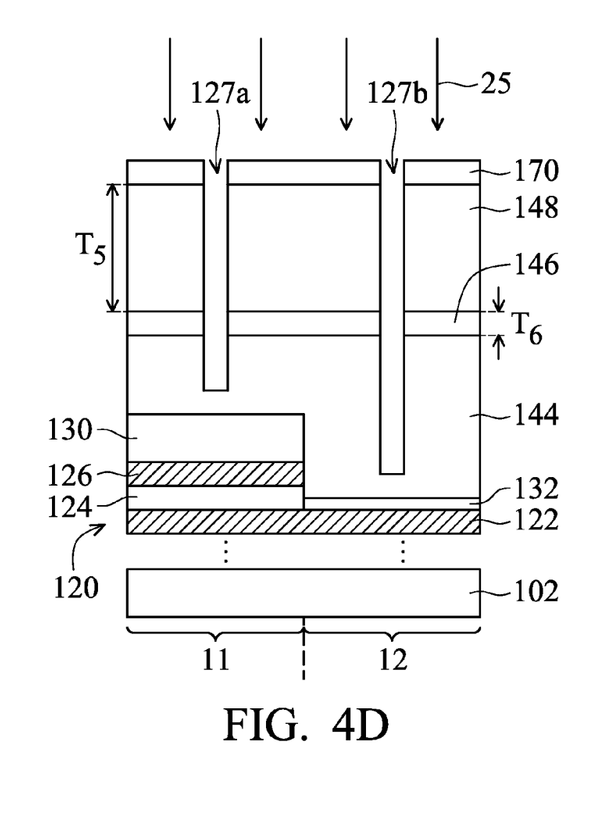

Afterwards, the remaining middle stop layer 146 and portions of first via dielectric layer 144 are removed by a third etching process 25 to form a deeper first via hole 127a and deeper second via hole 127b as shown in FIG. 4D in accordance with some embodiments. In some embodiments, the etching parameters used in third etching process 25 is similar to or the same with that used in first etching process 15'.

In some embodiments, an etching gas including $CF_4$, $CHF_3$, or combinations thereof is used in third etching process 25. In some embodiments, third etching process 25 is performed under a power in a range from about 1000 W to about 2500 W.

Figure 4E:
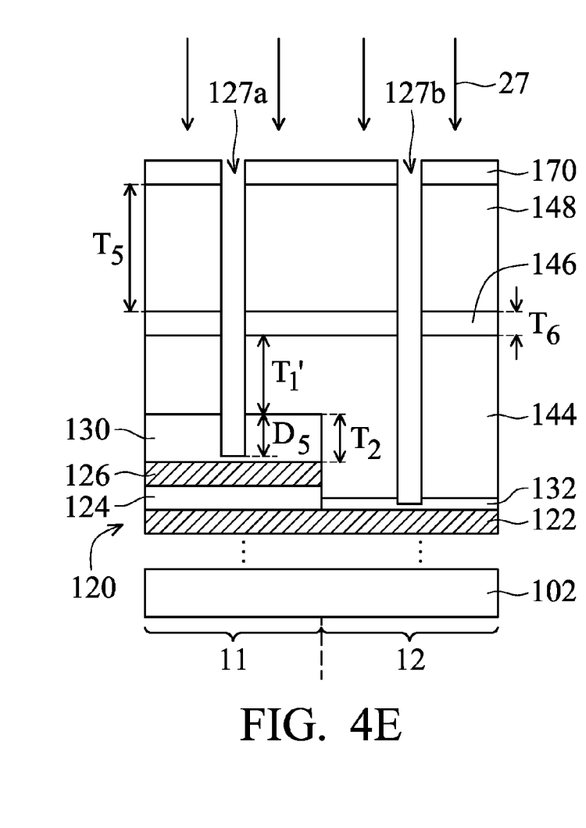

Afterwards, the remaining first via dielectric layer 144 and a portion of first etch stop layer 130, and second etch stop layer 132 are removed by fourth etching process 27 as shown in FIG. 4E in accordance with some embodiments. Fourth etching process 27 which is also an over etching process is used to etch first via dielectric layer 144 completely. It should be noted that first via dielectric layer 144 over MIM region 11 has a thickness $T_1'$ which is relatively smaller than thickness $T_1$ of via dielectric layer 142 as shown in FIG. 3B. Therefore, the over etched depth by fourth etching process 27 is smaller than that by second etching process 17 as shown in FIG. 3B. In some embodiments, over etched depth $D_5$ by fourth etching process 27 is smaller than thickness $T_2$ of first etch stop layer 130. As a result, after fourth etching process 27, a bottom of first via hole 127a is located above CTM layer 126 over MIM region 11 and a bottom of second via hole 127b is located above CBM layer 122 over non-MIM region 12.

Figure 4F:
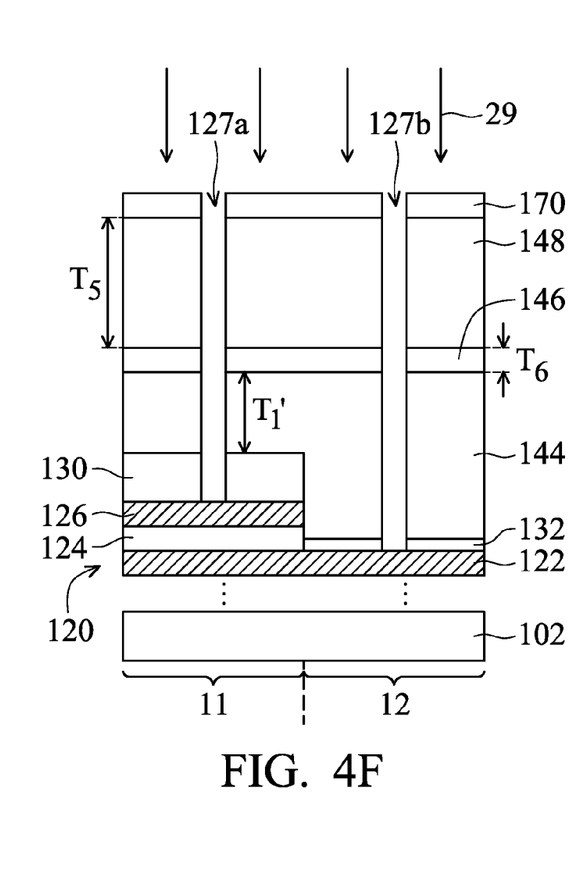

Afterwards, the remaining first etch stop layer 130 is removed by fifth etching process 29 as shown in FIG. 4F in accordance with some embodiments. Fifth etching process 29 is used to remove all of the first etch stop layer 130 over MIM region 11 and all of the second etch stop layer over non-MIM region 12. It should be noted that a bottom of via hole 127a over MIM region 11 is level with a bottom of first etch stop layer 130, and a bottom of via hole 127b over non-MIM region is level with a bottom of second etch stop layer 132. In addition, first via hole 127a does not extend through CTM layer 130, and second via hole 127b does not extend through CBM layer 122.

In some embodiments, first etching stop layer 130 is more than one layer, and a bottom layer of first etching stop layer 130 is made of silicon nitride. An etching gas including $CF_4$, $N_2$, or combinations thereof is used in third etching process 29 to remove silicon nitride.

Figure 4G:
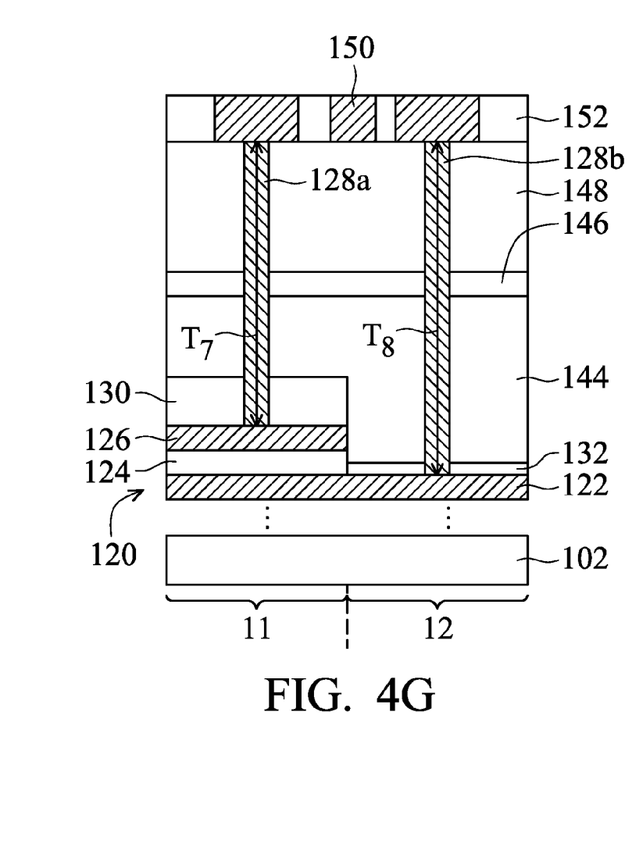

Afterwards, conductive materials are filled in first via hole 127a and second via hole 127b to form a first via 128a over MIM region 11 and a second via 128b over non-MIM region 12 as shown in FIG. 4G in accordance with some embodiments. The conductive materials are such as copper (Cu), copper alloy, aluminum (Al), aluminum (Al) alloy, tungsten (W) or tungsten (W) alloy. Afterwards, inductor dielectric layer 152 is formed over second via dielectric layer 148 and inductor 150 is embedded in inductor dielectric layer 152. Therefore, inductor 150 is electrically connected to CTM layer 126 by first via 128a or to CBM layer 122 by second via 128b.

As shown in FIG. 4G, a bottom of first via 128a is level with a bottom of first etch stop layer 130, and a bottom of second via 128b is level with a bottom of second etch stop layer 132. In some embodiments, first via 128a over MIM region 11 has a thickness $T_7$ in a range from about 3000 A to about 100K A. In some embodiments, via 128b over non-MIM region 12 has a thickness $T_8$ in a range from about 3000 A to about 100K A. In some embodiments, the middle etch stop layer 146 has a thickness in a range from about 0.01 to about 0.2 of thickness $T_7$. In some embodiments, a distance between the CTM layer 126 and middle etch stop layer 146 is in a range from about 0.1 to about 0.6 of thickness $T_7$.

Embodiments of mechanisms of forming a via between a MIM capacitor and an inductor are provided. A middle stop layer is inserted in a via dielectric layer. Because of the design of the middle etch stop layer, an over etched depth by an over etching process (e.g. second etching process, fourth etching process) is controlled and is not larger than a thickness of the etch stop layer (e.g. middle etch stop layer, first etch stop layer or second etch stop layer). Therefore, the burn out problem is resolved. In addition, an MIM capacitor has improved performance.

In some embodiments, a semiconductor device structure is provided. The semiconductor device structure includes a metal-insulator-metal (MIM) capacitor formed on a substrate. The semiconductor device structure also includes an inductor formed on the MIM capacitor. The semiconductor device structure further includes a via formed between the MIM capacitor and the inductor, and the via is formed in a plurality of dielectric layers, and the dielectric layers comprise an etch stop layer.

In some embodiments, a semiconductor device structure is provided. The semiconductor device structure includes a substrate comprises a MIM region and a non-MIM region, and a capacitor bottom metal (CBM) layer is formed over the MIM region and the non-MIM region. The semiconductor device structure also includes an insulating layer formed on the CBM layer over the MIM region, and a capacitor top metal (CTM) layer formed on the insulating layer. The semiconductor device structure includes a first etch stop layer formed on the CTM layer, and a second etch stop layer formed on the CBM layer over non-MIM region. The semiconductor device structure further includes a dielectric layer formed over the first etch stop layer and the second etch stop layer, and the dielectric layer comprises a middle etch stop layer. The semiconductor device structure includes an inductor formed on the dielectric layer. The semiconductor device structure also includes a first via formed between the CTM layer and the inductor, and a second via formed between the CBM layer and the inductor.

In some embodiments, a method for forming a semiconductor device structure is provided. The method includes providing a substrate and forming a metal-insulator-metal (MIM) capacitor over the substrate. The method also includes forming a first etch stop layer on the metal-insulator-metal (MIM) capacitor. The method further includes forming a via dielectric layer on the first etch stop layer, and the via dielectric layer comprises a first via dielectric layer, a middle etch stop layer and a second via dielectric layer. The method includes forming a patterned photoresist layer on the via dielectric layer. The method also includes forming a via hole through the second via dielectric layer, and a bottom of the via hole is located above the middle etch stop layer. The method further includes extending the via hole through the middle etch stop layer, first via dielectric layer and the first etch stop layer to expose a capacitor top metal (CTM) layer of the MIM capacitor. The method includes filling a conductive material into the via hole to form a via.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a metal-insulator-metal (MIM) capacitor formed on a substrate, wherein the MIM capacitor comprises a capacitor top metal (CTM) layer, an insulating layer and a capacitor bottom metal (CBM) layer;
   an inductor formed on the MIM capacitor;
   a via formed between the MIM capacitor and the inductor, wherein the via is formed in a plurality of dielectric layers, and the dielectric layers comprise an etch stop layer;
   a second etch stop layer formed above a top of the MIM capacitor, wherein a bottom of the via is level with a bottom of the second etch stop layer;
   a second via formed between the inductor and the CBM layer and in contact with the CBM layer; and
   a third etch stop layer formed above the CBM layer, wherein a bottom of the second via is level with a bottom of the third etch stop layer, and the bottom of the second via is in contact with the CBM layer.

2. The semiconductor device structure as claimed in claim 1, wherein the etch stop layer is made of silicon nitride (SiN), silicon oxynitride (SiON), silicon carbide (SiC), silicon oxycarbide (SiCO), or silicon carbide nitride (SiCN).

3. The semiconductor device structure as claimed in claim 1, wherein the via has a first height, and the etch stop layer has a thickness in a range from about 0.01 to about 0.2 of the first height.

4. The semiconductor device structure as claimed in claim 1, wherein the via has a first height, and a distance between the CTM layer and the etch stop layer is in a range from about 0.1 to about 0.6 of the first height.

5. The semiconductor device structure as claimed in claim 1, wherein
   the second etch stop layer is entirely above and in contact with the CTM layer, and the bottom of the via is in contact with the CTM layer.

6. The semiconductor device structure as claimed in claim 5,
   wherein the second etch stop layer has a thickness larger than that of the third etch stop layer.

7. The semiconductor device structure as claimed in claim 1, wherein the via has a thickness in a range from about 3000 A to about 100K A.

8. The semiconductor device structure as claimed in claim 1, wherein the CBM layer has a thickness in a range from about 1000 A to about 20000 A, and the CTM layer has a thickness in a range from about 500 A to about 2000 A.

9. A semiconductor device structure, comprising:
   a substrate comprising an MIM region and a non-MIM region;
   a capacitor bottom metal (CBM) layer formed over the MIM region and the non-MIM region;
   an insulating layer formed on the CBM layer over MIM region;
   a capacitor top metal (CTM) layer formed on the insulating layer;
   a first etch stop layer formed above the CTM layer;
   a second etch stop layer formed above the CBM layer over non-MIM region;
   a dielectric layer formed over the first etch stop layer and the second etch stop layer, wherein the dielectric layer comprises a middle etch stop layer;
   an inductor formed on the dielectric layer;
   a first via formed between the CTM layer and the inductor, wherein a bottom of the first via is level with a bottom of the first etch stop layer; and
   a second via formed between the CBM layer and the inductor,
   wherein a bottom of the second via is level with a bottom of the second etch stop layer, and the bottom of the second via is in contact with the CBM layer.

10. The semiconductor device structure as claimed in claim 9, wherein the first via has a first height, and a distance between the CTM layer and the middle etch stop layer is in a range from about 0.1 to about 0.6 of the first height.

11. The semiconductor device structure as claimed in claim 9, wherein the first via has a first height, and the middle etch stop layer has a thickness in a range from about 0.01 to about 0.2 of the first height.

12. The semiconductor device structure as claimed in claim 9, wherein the middle etch stop layer is made of silicon nitride (SiN), silicon oxynitride (SiON), silicon carbide (SiC), silicon oxycarbide (SiCO), or silicon carbide nitride (SiCN).

13. The semiconductor device structure as claimed in claim 9, wherein the first etch stop layer is entirely above and in contact with the CTM layer, and the bottom of the first via is in contact with the CTM layer.

14. The semiconductor device structure as claimed in claim 9, wherein the first via has a thickness in a range from about 3000 A to about 100K A.

15. The semiconductor device structure as claimed in claim 9, wherein the CBM layer has a thickness in a range from about 1000 A to about 20000 A, and the CTM layer has a thickness in a range from about 500 A to about 2000 A.

16. The semiconductor device structure as claimed in claim 9, wherein the first etch stop layer has a thickness larger than that of the second etch stop layer.

* * * * *